United States Patent [19]

Morizane et al.

[11] Patent Number: 5,133,810
[45] Date of Patent: Jul. 28, 1992

[54] FLEXIBLE PHOTOVOLTAIC DEVICE AND MANUFACTURING METHOD THEREOF

[75] Inventors: Masashi Morizane, Hirakata; Koichi Okada, Moriguchi; Kenji Murata, Kyoto; Hiroshi Inoue, Osaka; Yasuo Kishi, Hirakata, all of Japan

[73] Assignee: Sanyo Electric Co., Ltd., Osaka, Japan

[21] Appl. No.: 689,352

[22] Filed: Apr. 22, 1991

[30] Foreign Application Priority Data

Apr. 27, 1990 [JP] Japan .................. 2-112187

[51] Int. Cl.[5] .................. H01L 31/048; H01L 31/18
[52] U.S. Cl. .................. 136/251; 136/244; 437/2; 437/4
[58] Field of Search .............. 136/244, 251, 258 AM; 437/2-5, 205-207, 209, 215

[56] References Cited

FOREIGN PATENT DOCUMENTS

| 3231798A1 | 3/1984 | Fed. Rep. of Germany | 136/251 |
| 63-107073 | 5/1988 | Japan | 136/251 |
| 1-105581 | 4/1989 | Japan | 136/244 |

Primary Examiner—Aaron Weisstuch
Attorney, Agent, or Firm—David G. Conlin; Robert M. Asher

[57] ABSTRACT

A method of manufacturing a photovoltaic device includes the steps of: preparing a plurality of photovoltaic elements each including an insulator film, a first electrode, an amorphous semiconductor film for photoelectric conversion and a second electrode stacked in this order on a supporting substrate; electrically connecting the photovoltaic elements with each other; attaching a common protection film onto the second electrodes of the photovoltaic elements; and removing the supporting substrate from the photovoltaic elements, wherein the protection film mechanically couples the plurality of photovoltaic elements with each other.

27 Claims, 6 Drawing Sheets

FLEXIBLE PHOTOVOLTAIC DEVICE AND MANUFACTURING METHOD THEREOF

BACKGROUND OF THE INVENTION

1. Field of the Invention

The present invention relates generally to photovoltaic devices and manufacturing methods thereof and, more particularly, to a flexible photovoltaic device having a large area and a method of manufacturing such a device.

2. Description of the Background Art

FIGS. 1A-1D illustrate a manufacture process of a flexible photovoltaic element shown in Japanese Patent Laying-Open No. 1-105581.

Referring to FIG. 1A, a flexible transparent insulator film 2 is formed on a supporting substrate 1. A photoelectric conversion film 3 is formed on transparent insulator film 2. Photoelectric conversion film 3 includes a transparent front electrode, an amorphous semiconductor film for photoelectric conversion, and a back electrode stacked in this order on the transparent insulator film 2. Output terminals 4 connected to the front and back electrodes are provided on the back electrode side.

Referring to FIG. 1B, a flexible resin layer 5 having holes corresponding to output terminals 4 is formed on photoelectric conversion film 3.

With reference to FIG. 1C, transparent insulator film 2 is separated from supporting substrate 1 in water, resulting in a flexible photovoltaic element 10 shown in FIG. 1D.

Resin layer 5 formed on a back surface of photoelectric conversion film 3 is provided to prevent flexible photovoltaic element 10 from curling. More specifically, flexible photovoltaic element 10 is in general liable to curl due to the shrinking force of transparent insulator film 2 in the absence of resin layer 5. Thus, resin layer 5 having equal shrinking force with that of transparent insulator film 2 is formed on the back surface of photoelectric conversion film 3.

Polyimide resins which are flexible and superior in heat resisting properties have conventionally been used as the material of transparent insulator film 2. Photovoltaic element 10 utilizing such polyimide resins is flexible and can also easily be attached onto a curved surface.

Photovoltaic element 10 shown in FIG. 1D cannot require a significantly large area due to restrictions on the manufacture thereof, and hence the element has in general an area of 10 cm×10 cm. Thus, a plurality of photovoltaic elements 10 are combined together when a photovoltaic device which supplies electric power of several watts or more is formed.

In the combination of photovoltaic elements 10, leads are soldered between output terminals 4 on photovoltaic elements 10. A common front protection film made such as of PET (Polyethylene terephthalate) is attached onto transparent insulator films 2 of electrically connected photovoltaic elements 10. In order to protect the output terminals 4 and the leads, a common back protection film made of PET is attached onto resin layer 5. This results in a flexible photovoltaic device having a large area and including plurality of photovoltaic elements 10.

In the photovoltaic device with a large area according to the above-described conventional art, resin layer 5 should be provided in order to prevent the curling of photovoltaic elements 10, and the back protection film should be attached thereon. Accordingly, the photovoltaic device according to the conventional art requires a large number of material parts or components and can hardly attain a sufficient flexibility.

SUMMARY OF THE INVENTION

In view of such conventional art, one object of the present invention is to provide a photovoltaic device with a large area having a sufficient flexibility.

Another object of the present invention is to provide a method in which a photovoltaic device with a large area having a sufficient flexibility can easily be manufactured.

A photovoltaic device according to one aspect of the present invention includes: a plurality of photovoltaic elements each including a first electrode, an amorphous semiconductor film for photoelectric conversion and a second electrode stacked in this order on an insulator film; a plurality of conductors for electrically connecting the plurality of photovoltaic elements; and a common protection film attached on the second electrodes of the plurality of photovoltaic elements, the common protection film mechanically connecting the plurality of photovoltaic elements with each other.

A method of manufacturing a photovoltaic device according to another aspect of the present invention includes the steps of: preparing a plurality of photovoltaic elements each including an insulator film, a first electrode, an amorphous semiconductor film for photoelectric conversion and a second electrode stacked in this order on a supporting substrate; electrically connecting the plurality of photovoltaic elements with each other; attaching a common protection film onto the second electrodes of the plurality of photovoltaic elements; and removing the supporting substrate from the photovoltaic elements, wherein the common protection film mechanically couples the plurality of photovoltaic elements with each other.

A method of manufacturing a photovoltaic device according to still another aspect of the present invention includes the steps of: preparing a plurality of photovoltaic elements each including an insulator film, a first electrode, an amorphous semiconductor film for photoelectric conversion, and a second electrode stacked in this order on a supporting substrate; attaching a common protection film having a plurality of conductors in predetermined positions onto the second electrodes of the plurality of photovoltaic elements, whereby the plurality of photovoltaic elements are electrically connected and also mechanically coupled with each other; and removing the supporting substrate from the photovoltaic elements.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

FIGS. 2A-2E illustrate a manufacturing process of a photovoltaic device according to a first embodiment of the present invention.

Figure 1A:
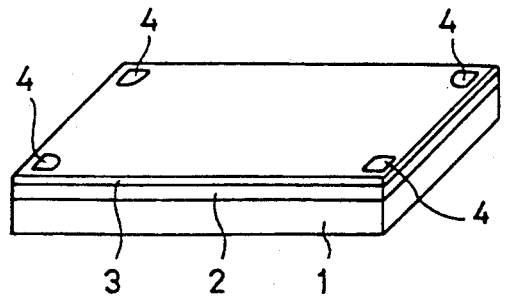
FIGS. 1A-1D are perspective views for illustrating a manufacturing process of a flexible photovoltaic element according to conventional art.
Figure 1B:
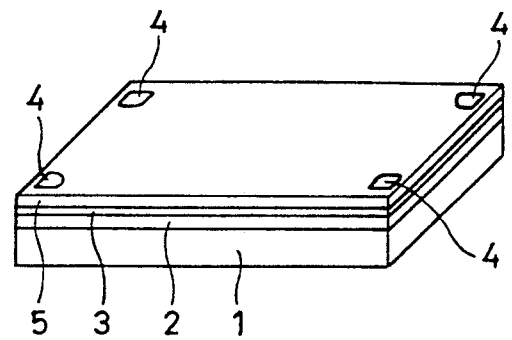
Figure 1C:
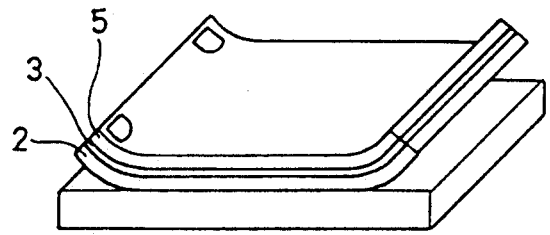
Figure 1D:
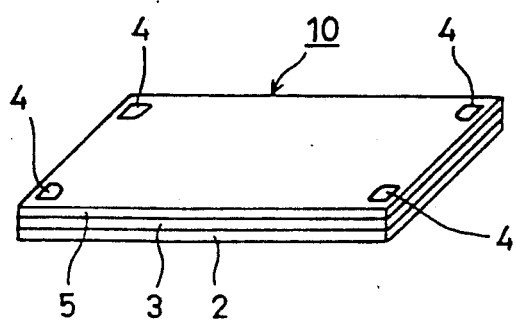
Figure 2A:
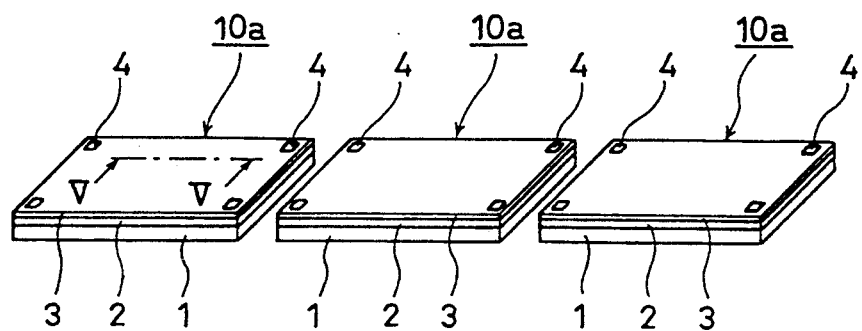
FIGS. 2A-2E are perspective views for illustrating a manufacturing process of a photovoltaic device according to a first embodiment of the present invention.

Referring to FIG. 2A, a transparent insulator film 2 made of such as polyimide, is provided on each of a plurality of supporting substrates 1 made of glass or the like. A photoelectric conversion film 3 is provided on transparent insulator film 2. Photoelectric conversion film 3 includes a transparent front electrode, an amorphous semiconductor film for photoelectric conversion and a back electrode stacked in this order on the transparent insulator film 2. Output terminals 4 connected to the front and back electrodes are provided on the back electrode side. It should be noted here that photovoltaic elements 10a supported by substrates 1 in FIG. 2A include no resin layer 5 as shown in FIG. 1B.

Figure 2B:
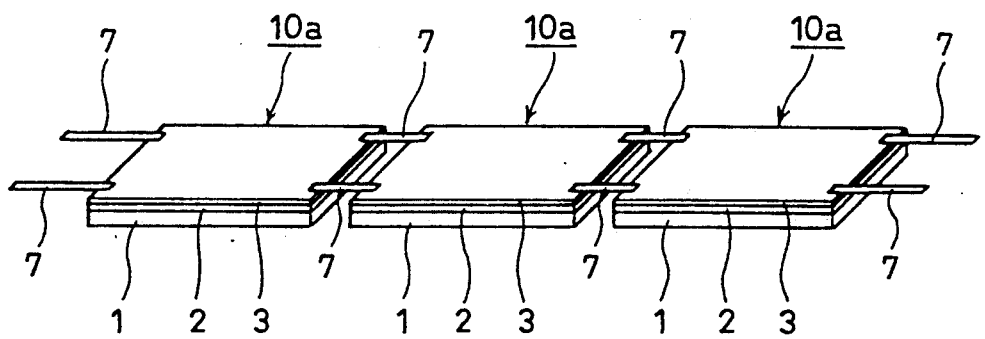

Referring to FIG. 2B, output terminals 4 on the plurality of photovoltaic elements 10a are electrically connected with each other by conductors 7. At this time, photovoltaic elements 10a are supported by substrates 1 and hence do not curl. This facilitates connecting the output terminals 4 with each other by conductors 7.

Figure 2C:
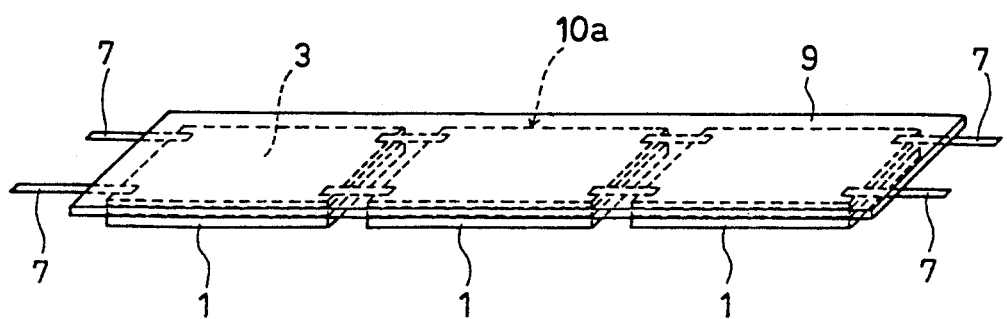

With reference to FIG. 2C, a common back protection film 9 made such as of PET coated with thermoplastic resins is laminated on the back electrodes of photovoltaic elements 10a by a heat roller while covering output terminals 4 and conductors 7. Accordingly, plurality of photovoltaic elements 10a are mechanically coupled with each other by back protection film 9.

Figure 2D:
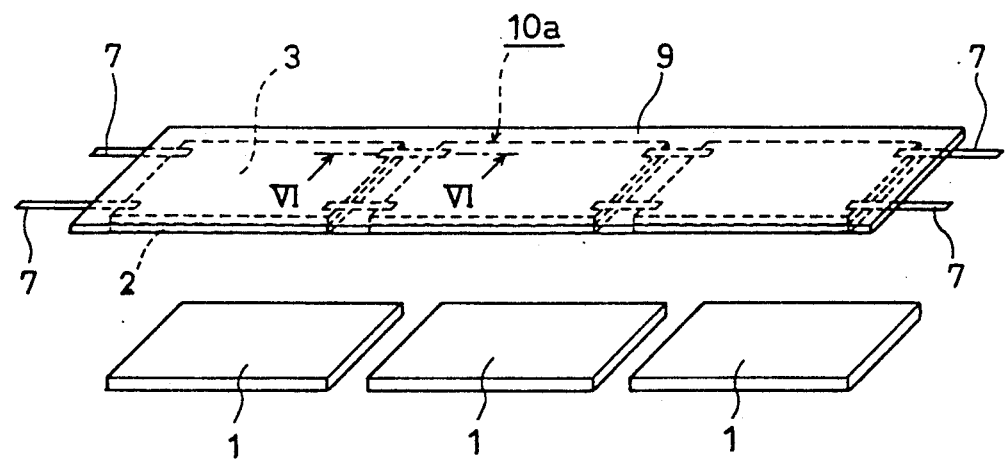

Referring to FIG. 2D, supporting substrates 1 are separated in water from the plurality of photovoltaic elements 10a coupled with each other. At this time, back protection film 9 serves also to prevent the curling of photovoltaic elements 10a separated from supporting substrates 1.

Figure 2E:
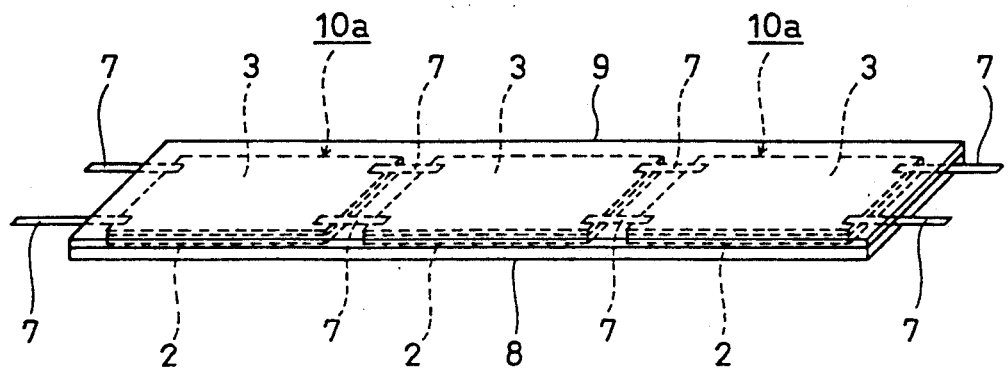

With reference to FIG. 2E, a common front protection film 8 made of such as PET coated with thermoplastic resins is laminated on the transparent insulator film 2 of the photovoltaic elements 10a by the heat roller. Accordingly, a flexible photovoltaic device having a large area and including plurality of electrically connected photovoltaic elements 10a interposed between front protection film 8 and back protection film 9 is completed.

While insulator film 2 is transparent in the description of the first embodiment, insulator film 2 may be formed by employing opaque polyimide resins. In this case, photoelectric conversion film 3 may include a back electrode formed on opaque insulator film 2, an amorphous semiconductor film for photoelectric conversion and a transparent front electrode. Further, output terminals 4 connected to the front and back electrodes are provided on the front electrode side.

Figure 3:
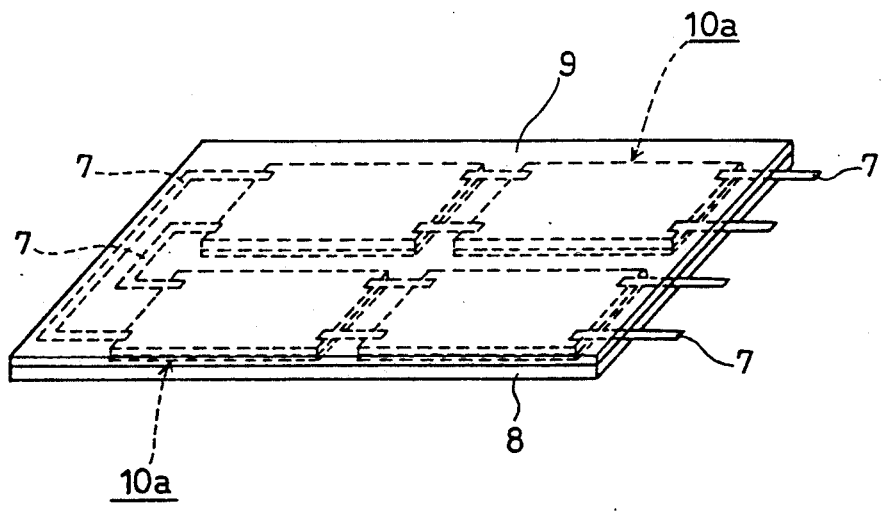
FIG. 3 is a perspective view of a photovoltaic device including a plurality of photovoltaic elements arranged two-dimensionally.

In addition, while the plurality of photovoltaic elements are arranged unidimensionally in the photovoltaic device of FIG. 2E, it is needless to say that these elements can also be arranged two-dimensionally as shown in FIG. 3.

Figure 4:
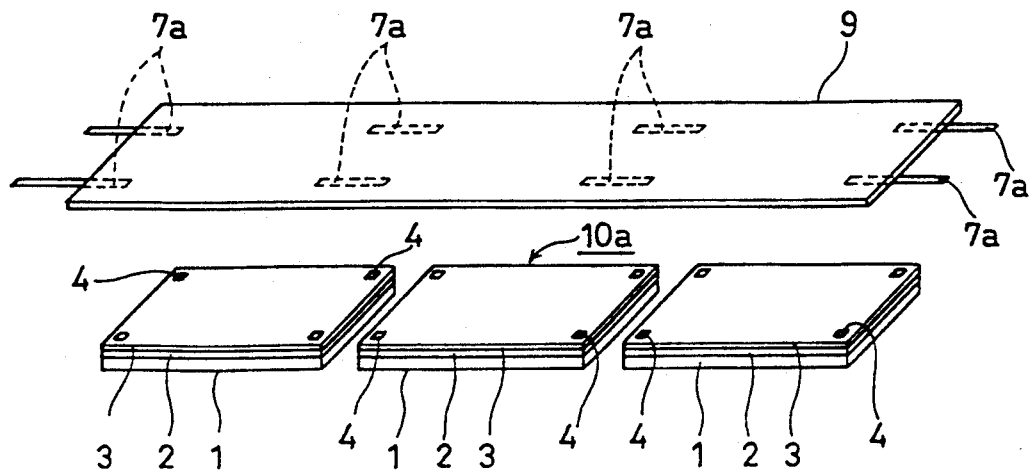
FIG. 4 is a perspective view for illustrating a manufacturing process of a photovoltaic device according to a second embodiment of the present invention.

FIG. 4 illustrates a manufacturing process of a photovoltaic device according to a second embodiment of the present invention. The second embodiment is similar to the first embodiment; however, conductors 7a for electrically connecting between output terminals 4 are provided in advance on a common back protection film 9. The provision of these conductors 7a is enabled by disposing solder-coated copper foils at predetermined positions on back protection film 9. Conductors 7a can be formed by screen-printing conductive pastes such as silver pastes at predetermined positions on backprotection film 9 and hardening the pastes.

Solder-bumps are provided in advance on output terminals 4 of photovoltaic elements 10a. Back protection film 9 is laminated on the back electrodes of photovoltaic elements 10a by a heat roller, with conductors 7a being in registration with output terminals 4. This attains electrical connections and mechanical couplings between the plurality of photovoltaic elements 10a at the same time.

After that, like the first embodiment, supporting substrates 1 are separated in water from photovoltaic elements 10a. A common front protection film 8 is then laminated on a transparent insulator film 2 of photovoltaic element 10a, thereby obtaining a flexible photovoltaic device a large area.

FIGS. 5A-5D manufacturing process of one example of photovoltaic elements 10a that can be employed in the photovoltaic device of the present invention, with respect to cross-sectional views taken along the lines V—V of FIG. 2A.

Figure 5A:
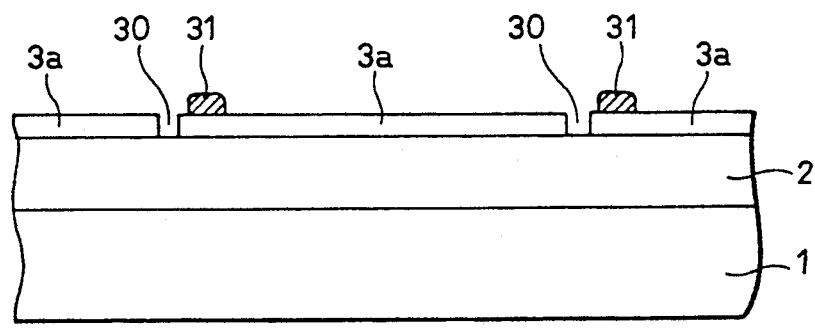
FIGS. 5A-5D are cross-sectional views taken along lines V—V of FIG. 2A and showing a manufacturing process of one example of the photovoltaic elements.

Referring to FIG. 5A, a flexible transparent insulator film 2 made of such as polyimide and having an area of approximately 10 cm×10 cm and a thickness of 10 μm-2 mm is formed on a supporting substrate 1 made of such as glass. A single layer of transparent conductive oxide (TCO) represented by tin oxide or indium oxide, or a transparent electrode film formed of a stacked TCO layer is formed on transparent insulator film 2. Then, the transparent electrode film is divided into a plurality of transparent electrodes 3a by isolation grooves 30 formed by etching or laser beam irradiation.

A conductor line 31 is formed on each of transparent electrodes 3a along the right side of each isolation groove 30. Conductor lines 31 can be formed by screen-printing silver pastes of polyimide type and hardening the pastes at a temperature of 200°-350° C. Conductor lines 31 have, in general, widths of 0.1-0.5 mm and thicknesses of 5-30 μm.

Figure 5B:
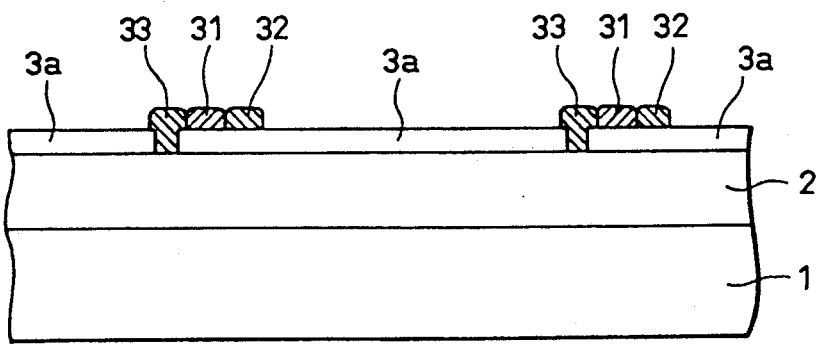

With reference to FIG. 5B, a first insulator line 32 is formed adjacent to the right side of each of conductor lines 31. A second insulator line 33 is formed to fill each of isolation grooves 30. These first and second insulator lines 32 and 33 can be formed by screen-printing an insulative paste of polyimide type and hardening the paste at a temperature of 250°-300° C. First and second insulator lines 32 and 33 have, in general, widths of 0.1-0.5 mm and thicknesses of 5-30 μm.

Figure 5C:
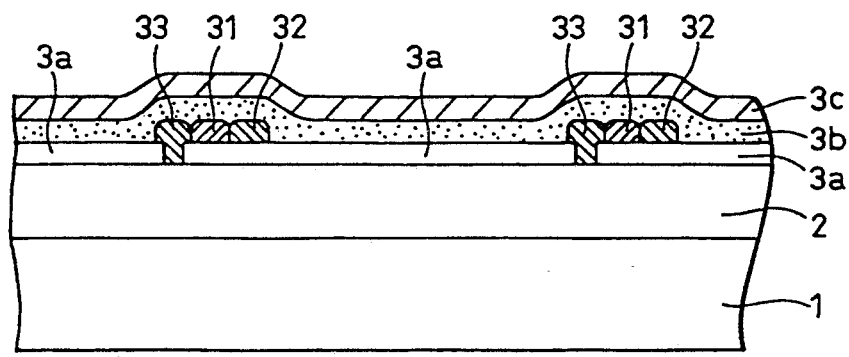

Referring to FIG. 5C, amorphous silicon layers of p type, i type and n type are sequentially deposited to cover transparent electrodes 3a, conductor lines 31, and first and second insulator lines 32 and 33. Thus, an amorphous semiconductor film 3b for photoelectric conversion is formed. A back electrode 3c formed of a single layer or a stacked layer made of such as aluminum, silver, or titanium is formed on amorphous semiconductor film 3b.

Figure 5D:
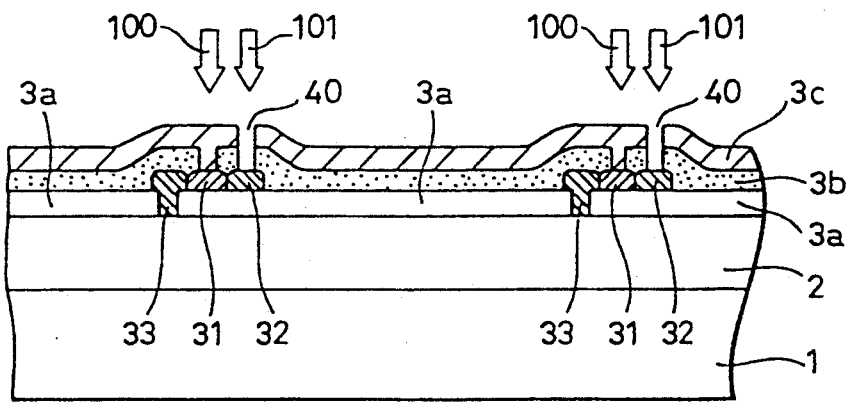

Referring to FIG. 5D, back electrode 3c and conductor lines 31 are electrically connected with each other by directing a first laser beam 100 over back electrode 3c downward to conductor lines 31 to melt a portion of the back electrode. Further, second isolation grooves 40 are formed by directing a second laser beam 101 having a higher intensity than that of first laser beam 100 over back electrode 3c downward to first insulator lines 32, to remove portions of back electrode 3c and semiconductor film 3b. This enables formation of an integrated-type photovoltaic element 10a including a plurality of photoelectric conversion cells connected in series.

Figure 6:
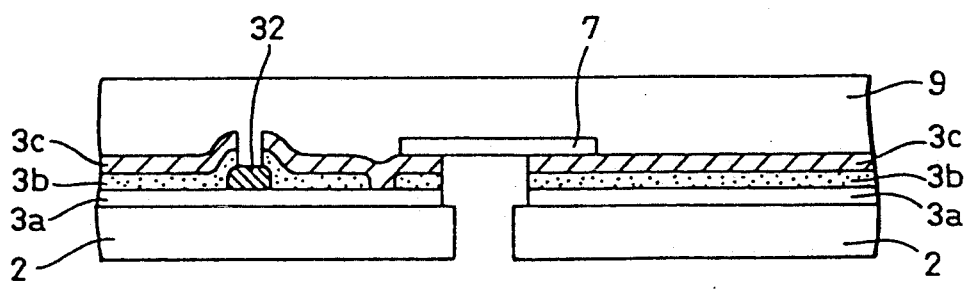
FIG. 6 is a cross-sectional view taken along lines VI—VI of FIG. 2D and including the photovoltaic element formed through the steps of FIGS. 5A-5D.

With reference to FIG. 6, a photovoltaic device including plurality of photovoltaic elements 10a formed through the steps of FIGS. 5A-5D is shown in the cross-section taken along lines VI—VI of FIG. 2D.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photovoltaic device, comprising:
   a plurality of flexible photovoltaic elements each including a first electrode, an amorphous semiconductor film for photoelectric conversion, and a second electrode stacked in this order on an insulator film and each flexible photovoltaic element comprising a plurality of electrically interconnected unit solar cells;
   a plurality of conductors for electrically connecting said plurality of flexible photovoltaic elements with each other; and
   a common first protection film attached directly on said second electrodes of said plurality of flexible photovoltaic elements, said first protection film mechanically coupling said plurality of flexible photovoltaic elements with each other.

2. The photovoltaic device of claim 1, wherein said insulator film and said first electrode are transparent.

3. The photovoltaic device of claim 1, wherein said insulator film is opaque, and said second electrode and said first protection film are transparent.

4. The photovoltaic device of claim 1, further comprising a common second protection film attached on said insulator films of said plurality of photovoltaic elements.

5. The photovoltaic device of claim 1, wherein said insulator film comprises a polyimide resin.

6. The photovoltaic device of claim 1, wherein said first protection film comprises polyethylene terephthalate.

7. The photovoltaic device of claim 4, wherein said second protection film comprises polyethylene terephthalate.

8. A method of manufacturing a photovoltaic device, comprising the steps of:
   preparing a plurality of photovoltaic elements each including an insulator film, a first electrode, an amorphous semiconductor film for photoelectric conversion, and a second electrode stacked in this order on a supporting substrate and each photovoltaic element comprising a plurality of electrically interconnected unit solar cells;
   electrically connecting said plurality of photovoltaic elements with each other;
   attaching a common first protection film onto said second electrodes of said plurality of photovoltaic elements; and
   removing said supporting substrate from said photovoltaic elements, wherein
   said first protection film mechanically couples said plurality of photovoltaic elements with each other.

9. The method of claim 8, wherein said insulator film and said first electrode are transparent.

10. The method of claim 8, wherein said insulator film is opaque, and said second electrode and said first protection film are transparent.

11. The method of claim 8, further comprising the step of
   attaching a common second protection film onto said insulator films of said plurality of photovoltaic elements.

12. The method of claim 8, wherein said insulator film comprises a polyimide resin.

13. The method of claim 12, wherein said supporting substrate is separated in water from said insulator film.

14. The method of claim 8, wherein said first protection film comprises polyethylene terephthalate.

15. The method of claim 14, wherein said first protection film is laminated on said second electrode by a heat roller.

16. The method of claim 11, wherein said second protection film comprises polyethylene terephthalate.

17. The method of claim 16, wherein said second protection film is laminated on said insulator film by a heat roller.

18. A method of manufacturing a photovoltaic device, comprising the steps of:
   preparing a plurality of photovoltaic elements each including an insulator film, a first electrode, an amorphous semiconductor film for photoelectric conversion, and a second electrode stacked in this order on a supporting substrate and each photovoltaic element comprising a plurality of electrically interconnected unit solar cells;
   attaching a common first protection film having a plurality of conductors at predetermined positions onto said second electrodes of said plurality of photovoltaic elements, so as to electrically connect and mechanically couple said plurality of photovoltaic elements with each other; and
   removing said supporting substrate from said photovoltaic elements.

19. The method of claim 18, wherein said insulator film and said first electrode are transparent.

20. The method of claim 18, wherein said insulator film is opaque, and said second electrode and said first protection film are transparent.

21. The method of claim 18, further comprising the step of
   attaching a common second protection film onto said insulator films of said plurality of photovoltaic elements.

22. The method of claim 18, wherein said insulator film comprises a polyimide resin.

23. The method of claim 22, wherein said supporting substrate is separated in water from said insulator film.

24. The method of claim 18, wherein said first protection film comprises polyethylene terephthalate.

25. The method of claim 24, wherein said first protection film is laminated on said second electrode by a heat roller.

26. The method of claim 21, wherein said second protection film comprises polyethylene terephthalate.

27. The method of claim 26, wherein said second protection film is laminated on said insulator film by a heat roller.

* * * * *